United States Patent

Kondo et al.

[11] Patent Number: 6,040,704
[45] Date of Patent: Mar. 21, 2000

[54] PROBE UNIT AND INSPECTION HEAD

[75] Inventors: Motoyasu Kondo, Mitaka; Fukuyo Sakuma, Houya; Youichi Urakawa; Yoshihito Yokoyama, both of Chofu; Masatoshi Hinai, Tokyo, all of Japan

[73] Assignee: Kabushiki Kaisha Nihon Micronics, Tokyo, Japan

[21] Appl. No.: 08/858,019

[22] Filed: May 16, 1997

[30] Foreign Application Priority Data

May 24, 1996 [JP] Japan .................................. 8-151847

[51] Int. Cl.⁷ ............................. G01R 31/02; G01R 1/06
[52] U.S. Cl. ......................... 324/762; 324/72.5; 324/754
[58] Field of Search ................................. 324/760–762, 324/757, 752, 754, 72.5

[56] References Cited

U.S. PATENT DOCUMENTS

| | | | |
|---|---|---|---|
| 4,480,223 | 10/1984 | Aigo | 324/752 |
| 4,523,144 | 6/1985 | Okubo et al. | 324/762 |
| 4,719,417 | 1/1988 | Evans | 324/762 |
| 5,606,263 | 2/1997 | Yoshizawa et al. | 324/761 |

FOREIGN PATENT DOCUMENTS

| | | |
|---|---|---|
| 59-762 | 1/1984 | Japan . |
| 2-216467A | 8/1990 | Japan . |
| 3-231438A | 10/1991 | Japan . |
| 07201935A | 8/1995 | Japan . |
| 08008312A | 1/1996 | Japan . |

Primary Examiner—Josie Ballato
Assistant Examiner—Minh Tang
Attorney, Agent, or Firm—Christensen O'Connor Johnson & Kindness PLLC

[57] ABSTRACT

A probe unit comprises a support member having an edge extending in a first direction parallel to the surface of a plate-like test substance; and a plurality of needle-like probes disposed on the edge and extended in a third direction intersecting the first direction and a second direction perpendicular to the surface of the test substance. The plurality of probes are divided into at least a first group and a second group arranged at intervals in the second direction.

7 Claims, 5 Drawing Sheets

PROBE UNIT AND INSPECTION HEAD

BACKGROUND OF THE INVENTION

1. Field of the Invention

The present invention relates to a probe unit for testing the electric characteristics of a device under test, i.e., plate-like test substance, such as a semiconductor wafer having the shape of a flat plate, and an inspection head employing the probe unit.

2. Description of the Prior Art

Generally, an inspection i.e., head called a probe card or a probe board is used for the performance test of an integrated circuit. Many conventional inspection heads, i.e., testing heads, are formed merely arranging a plurality of probes in a radial arrangement on a disk-shaped support base. Therefore, the conventional inspection heads are able to inspect only some chips formed on a semiconductor wafer simultaneously and take much time for inspecting one semiconductor wafer on which many integrated circuit chips are formed.

An inspection head disclosed in Japanese Patent Application Public Disclosure No. 7-201935 intended to solve the foregoing problems is provided with a plurality of probe units each provided with a plurality of probes arranged on the lower edge of a support member having the shape of a flat plate extending horizontally. In this prior art inspection head, however, electrical interference occurs between the adjacent probes, particularly, between signal probes and power probes because the probes are arranged in a single layer on the lower edge of the support member. Such electrical interference introduces great noise which exerts a harmful influence on inspection into signals on signal lines, particularly into signals on the signal probes.

SUMMARY OF THE INVENTION

It is an object of the present invention to prevent electrical interference between signal probes and power probes.

According to one aspect of the present invention, a probe unit comprises a support member having an edge extending in a first direction parallel to the surface of a paste-like test substance, and a plurality of needle-like probes disposed on the edge and extended in a third direction intersecting the first direction and a second direction perpendicular to the surface of the test substance. The probes are divided into at least first and second groups arranged at intervals in the second direction.

The probes of one of the first and second groups are used as signal probes, and the probes of the other group are used as power probes. When the signal probes and the power probes are spaced apart in a direction perpendicular to the test substance, the possibility of electrical interference between the signal probes and the power probes is very low as compared with that experienced when the signal probes and the power probes are arranged at the same position with respect to the second direction, and harmful influence of electrical interference is reduced greatly.

Since the plurality of probes are divided into at least a first group and a second group having axes arranged at intervals in the second direction, electrical interference between the signal probes and the power probes is reduced.

Preferably, a conductive layer is formed between the first and the second group, the probes of the second group are disposed nearer to the test substance than those of the first group. The conductive layer is connected to a part of a reference potential for inspection, such as an earth potential to prevent electrical interference between the probes of the two groups. Therefore, electrical interference between the two groups can more surely be prevented.

Preferably, a second conductive layer is formed at a position nearer to the test substance than the probes of the second group. The second conductive layer is connected to a part of a reference potential, such as an earth potential, to prevent electrical interference between the test substance and the probes of the second group.

Preferably, the probe unit further comprises at least one flexible flat cable having a plurality of lead portions electrically connected to the probes of the first group, and a wiring board having a plurality of lead portions electrically connected to the probes of the second group. Since the flat cable can be curved on an inspection apparatus, the dimension of the probe unit in the second direction is not increased. Electrical interference between the lead potions of the flat cable and the lead portions of the wiring board, i.e., between the signal lines and the power lines, can be prevented.

Preferably, the probe unit further comprises at least one capacitor mounted on the wiring board and electrically connected to the plurality of probes of the second group. Thus, the influence of noise generated in the power lines on the signal lines can be prevented. The capacitor supported on the wiring board is less liable to come off than that supported on a flat cable.

An inspection head according to the present invention comprises a plate-shaped support base provided with an opening, and at least one probe unit as stated above placed on the support base with the probes projecting from one surface of the support base.

In a preferred embodiment of the inspection head, the plurality of probe units are arranged side by side on the support base. The support base is further provided with a plurality of first electrodes to be electrically connected to a tester, a plurality of second electrodes electrically connected to the probes of the first group by a flexible flat cable, and a plurality of third electrodes electrically connected to the probes of the second group by a wiring board.

In a preferred embodiment of probe, the probes of each group are arranged at intervals in the first direction. The support member has the shape of a plate extending in the first direction. The flat cable is extended between the support member and the wiring board.

DETAILED DESCRIPTION OF THE PREFERRED EMBODIMENTS

Figure 1:
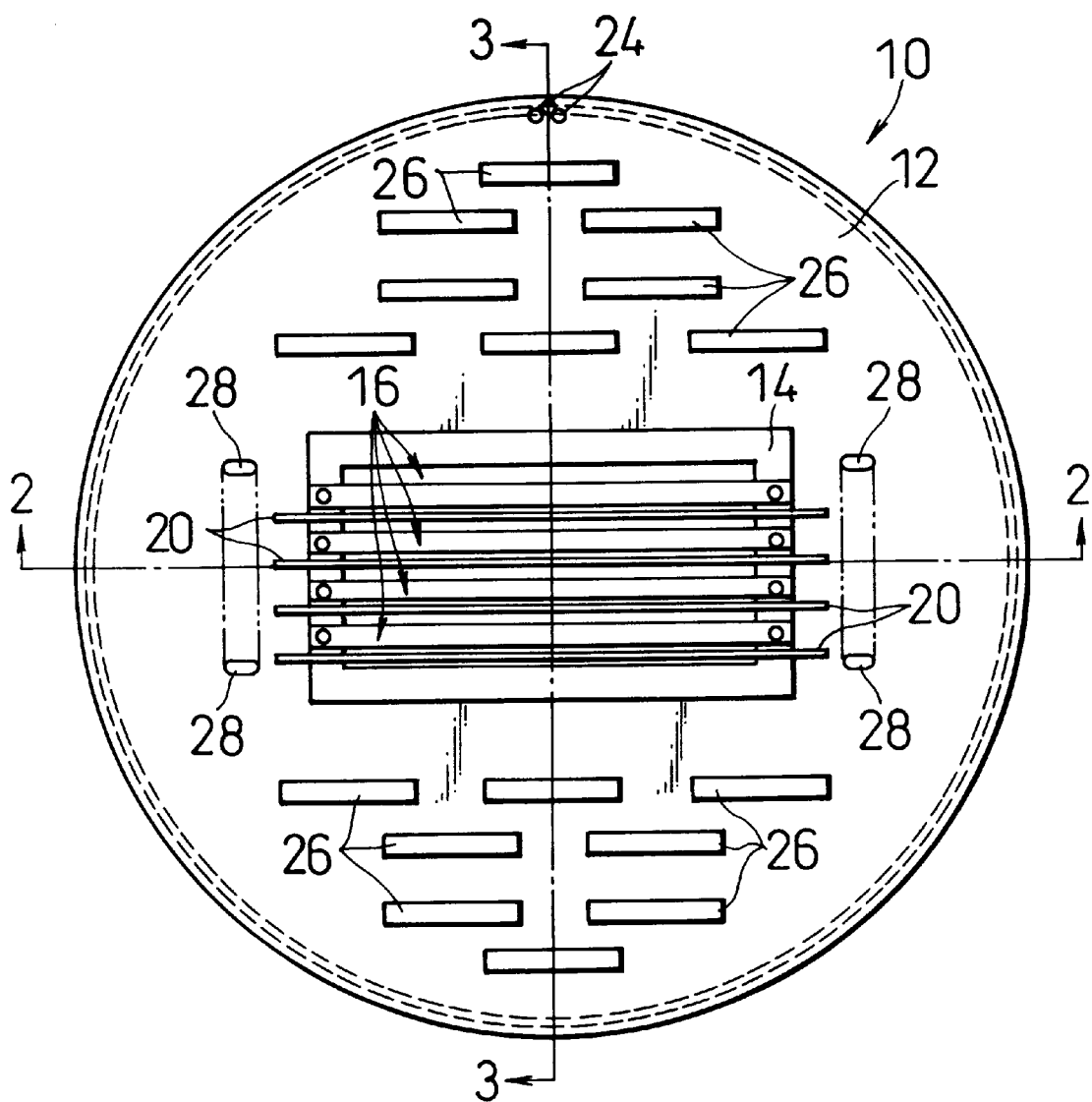
FIG. 1 is a plan view of an inspection head in a preferred embodiment employing probe units in accordance with the present invention.
Figure 2:
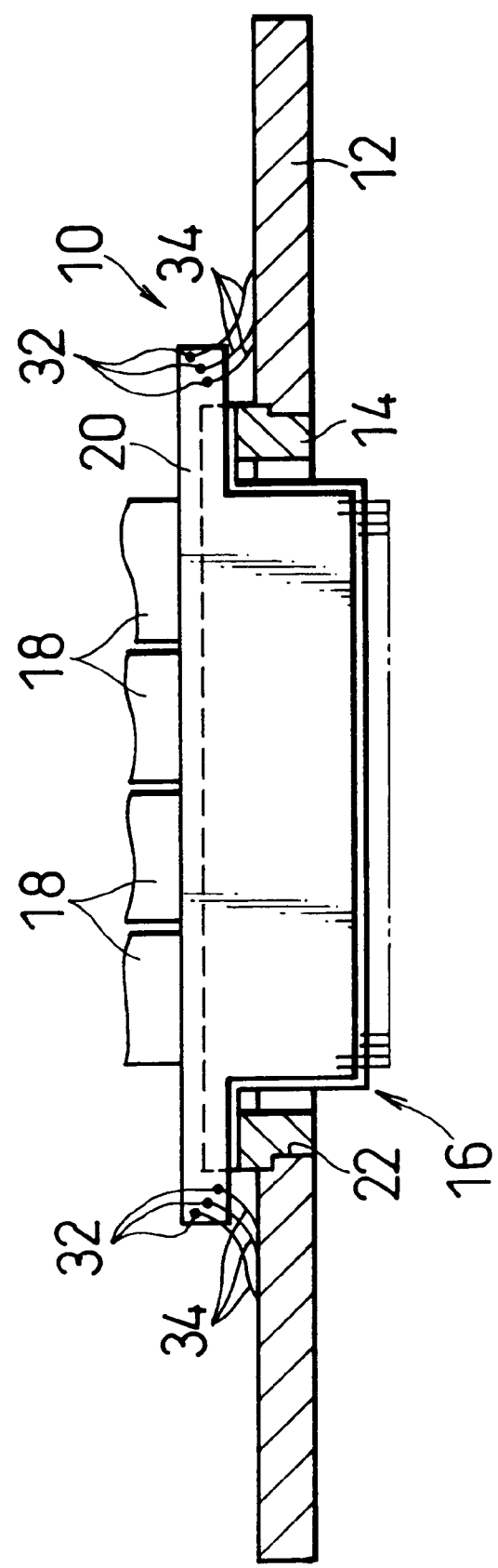
FIG. 2 is a sectional view taken on line 2—2 in FIG. 1.
Figure 3:
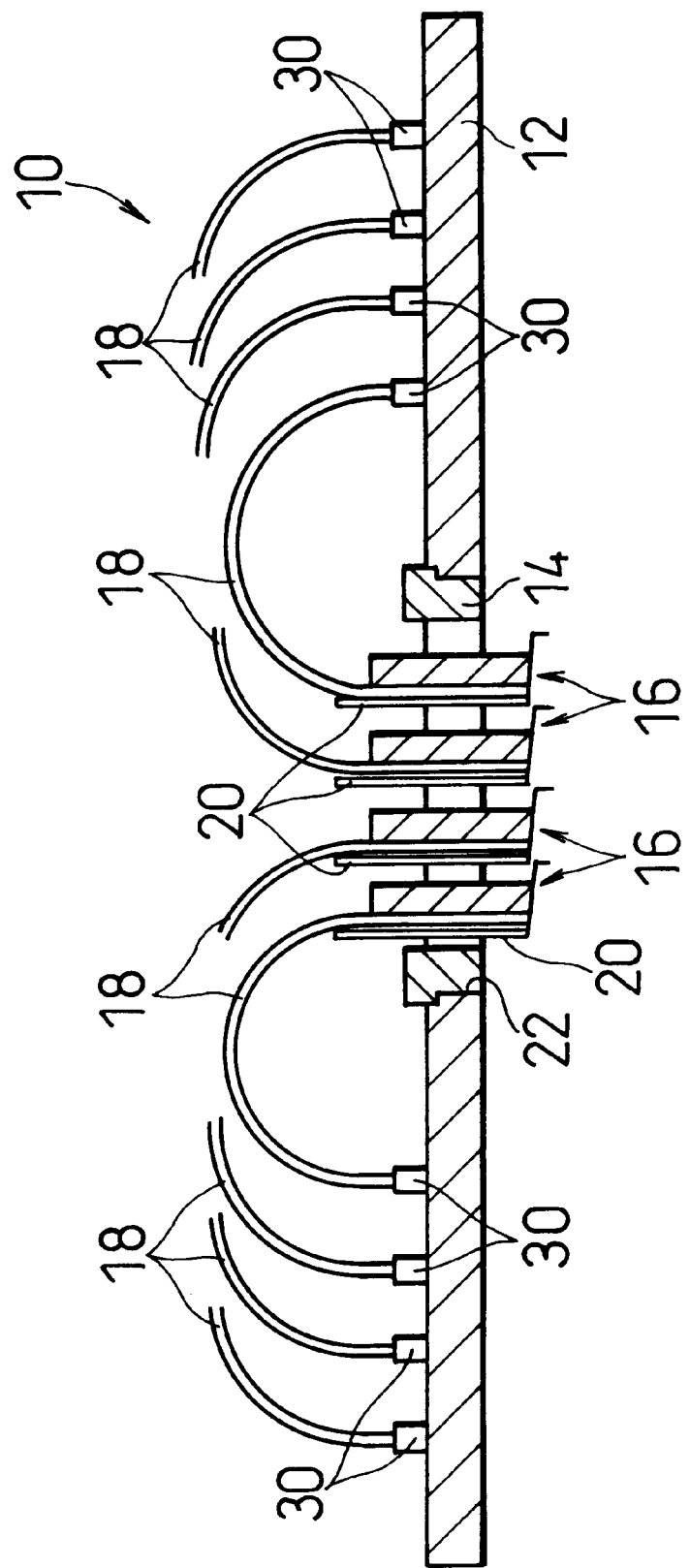
FIG. 3 is a sectional view taken on line 3—3 in FIG. 1.

Referring to FIGS. 1 to 3, an inspection head 10, i.e., testing head, is used for testing the performance of a plate-like test substance, i.e., device under test having the shape of a flat plate, such as a semiconductor wafer provided with a plurality of electrodes, i.e., terminals, arranged at small pitches.

The inspection head 10 comprises a disk-shaped base member 12, a support frame 14 attached to the base member 12, a plurality of probe units 16 attached to the support frame 14 in a parallel arrangement, a plurality of flexible flat cables 18 connected to the probe units 16, respectively, and a plurality of wiring board 20 connected to the probe units 16, respectively. The inspection head 10 is mounted on an inspection apparatus, i.e., tester, not shown, with the thickness of the base member 12 vertically extended. The flat cables 18 are not shown in FIG. 1.

The base member 12 is provided with a rectangular opening 22 in its central portion. A plurality of tester lands 24, i.e., first electrodes, to be electrically connected to an external tester are arranged in the peripheral region of the base member 12, a plurality of connector terminals 26, i.e., second electrodes, to be connected to the flat cables 18 are arranged in the central potion of the forward and backward direction the base member 12, and a plurality of power lands 28, i.e., third electrodes, to be electrically connected to the wiring board 20 are arranged in the central portion of the rightward and leftward direction of the base member 12. The tester lands 24, the connector terminals 26 and the power lands 28 may be formed by print circuit forming techniques on the base member 12.

The support frame 14 is fitted in the rectangular opening 22 and is fastened to the base member 12 with a plurality of screws or an adhesive. The probe units 16 have the shape of an elongate flat plate and are detachably fastened to the support frame 14 with a plurality of screws, not shown. The flat cables 18 and the wiring boards 20 are components of the probe units 16, respectively.

Each flat cable 18 is a flexible band-shaped wiring board having a plurality of conductive lead portions formed by printed wiring forming techniques, and has one end connected to a connector 30 connected to the connector terminals 26. The lead portions of each flat cable 18 are portions of signal lines. In this embodiment, the plurality of flat cables 18 are connected to each probe unit 16.

Figure 4:
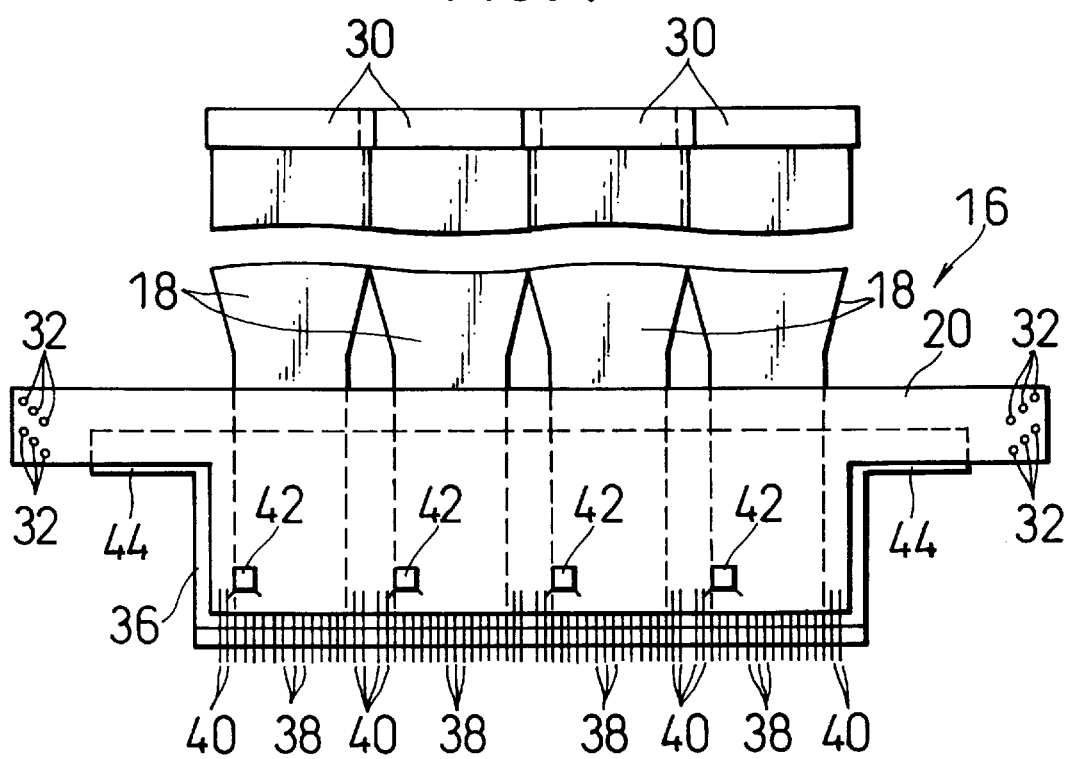
FIG. 4 is a front view of a probe unit in a preferred embodiment according to the present invention.
Figure 5:
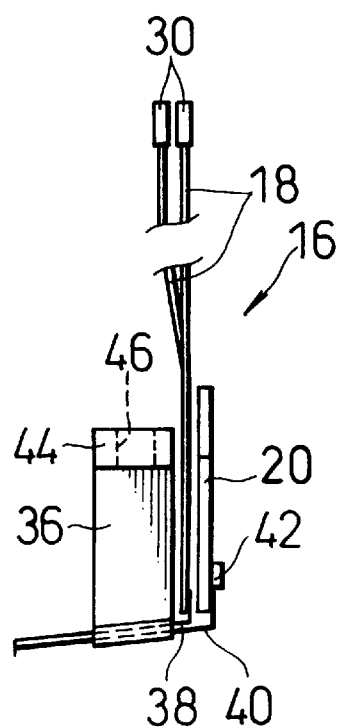
FIG. 5 is a side view of the probe unit of FIG. 4, showing the left side of the probe unit.
Figure 6:
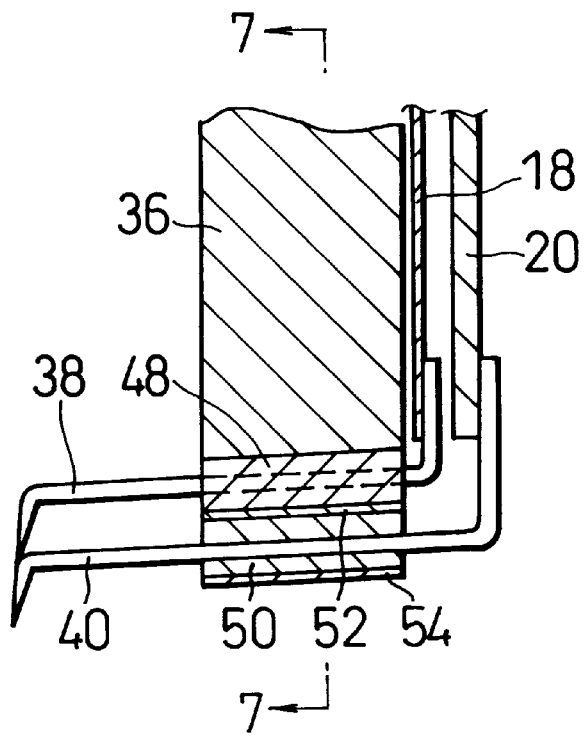
FIG. 6 is an enlarged sectional view of a lower portion of the probe unit of FIG. 4.

Each wiring board 20 is a T-shaped printed circuit board provided with a plurality of conductive lead portions formed by printed wiring forming techniques. As shown in FIG. 4, the wiring board 20 is provided in its upper portion with a plurality of lands 32, and the plurality of lead portions are electrically connected to the lands 32, respectively. In this embodiment, each probe unit 16 is provided with the one wiring board 20.

The lands 32 of each wiring board 20 are electrically connected to the power lands 28 of the base member 12 by lines 34 as shown in FIG. 2, respectively. At least one of the power lands 28 of the base member 12 is electrically grounded, and the rest of the lands 28 are electrically connected to power source terminals of a positive or a negative potential. Therefore, at least one of the lead portions of the wiring board 20 serve as an earth line and the rest of the lead portions serve as power lines, i.e., power feed lines.

Referring to FIGS. 4 to 7, each probe unit 16 comprises an elongate, cuboidal support member 36, a plurality of first probes 38 arranged in a lower portion of the support member 36 at intervals in longitudinal direction of the support member 36, a plurality of second probes 40 arranged in a lower portion of the support member 36 below the portion in which the first probes 38 are arranged, and a plurality of capacitors 42 arranged on the wiring board 20.

The support member 36 is a plate having a substantially rectangular cross section, and has flat lugs 44 each provided with a through hole 46 and longitudinally projecting from upper portions of the opposite end surfaces thereof, respectively. Screws are screwed through the through holes 46 of the lugs 44 in the support frame 14 shown in FIGS. 1 to 3 to attach the support member 36 to the support frame 14. The wiring board 20 is supported on the support frame 14.

The first probes 38 are arranged in parallel to each other and held on the lower surface of the support member 36 by a holder material 48 made of an electrically insulating material, such as a synthetic resin or an adhesive. The second probes 40 are arranged in parallel to each other and held on the lower surface of the holder material 48 by a holder material 50 made of an electrically insulating material, such as a synthetic resin or an adhesive. Thus, the first probes 38 and the second probes 40 are arranged in two layer structure with a space between the upper and lower layers on the lower edge of the support member 36. Axes of the first and second probes 38 and 40 are spaced in a direction perpendicular to the test substance.

A first conductive layer 52 is formed between the first holder material 48 and the second holder material 50, i.e., between the first probes 38 and the second probes 40, and a second conductive layer 54 is formed on the lower surface of the holder material 50. The first conductive layer 52 and the second conductive layer 54 are metal sheets or films of a metal, such as copper.

Figure 7:
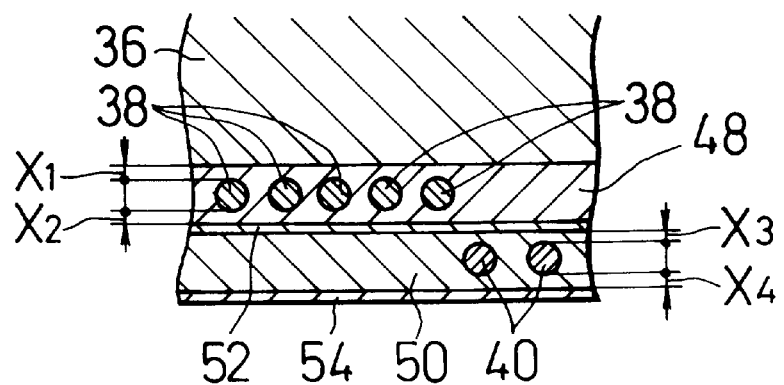
FIG. 7 is a sectional view taken on line 7—7 in FIG. 6.

Spaces X1, X2, X3 and X4 shown in FIG. 7 are determined so as to provide an optimum impedance for a tester, such as 50Ω. The probe unit 16 is formed so that the tips of the probes 38 and 40 are on a common plane.

Front portions of the first probes 38 and the second probes 40 are bent downward so that the tips of the probes 38 and 40 can easily be brought into contact with electrodes formed on a semiconductor wafer. The back ends of the first probes 38 are electrically connected to the lead portions of the flat cables 18 by soldering or the like. The second probes 40 are electrically connected to the lead portions of the wiring board 20 by soldering or the like.

The capacitors 42 are electrically connected to the lead portions of the wiring board 20 by soldering or the like. The capacitors 42 can more securely be connected to the lead portions of the wiring board 20 than to flat cables.

The probe units 16 are attached in parallel to each other on the support frame 14 with the wiring boards 20 and the support members 36 extending vertically through the support frame 14 and the probes 38 and 40 facing down, and the support members 36 are fastened to the support frame 14 with screws. The support frame 14 with the plurality of probe units 16 attached thereto is mounted on the base member 12 with the probes 38 and 40 projecting down.

The first probes 38 are electrically connected to the connectors 26 by the flat cables 18 and are used as signal probes for transmitting signals. The second probes 40 are electrically connected through the wiring board 20 and the lines 34 to the power lands 28 and are used as power probes for feeding power. The first conductive layer 52, the second conductive layer 54 and the support member 36 of each probe unit 16 are electrically grounded by lines, not shown. The first conductive layer 52 and the second conductive layer 54 may be electrically connected to the power land 28 of an earth potential through the wiring board 20 or lines.

The flat cables 18 are extended between the wiring board 20 and the support member 36. Therefore, electrical interference between the lead portions of the flat cables 18 and the lead portions of the wiring board 20, i.e., between the signal lines and the power lines, can be prevented.

As shown in FIG. 3, each flat cable 18 is extended in a curve and the connector 30 is connected to the connector 26 to form the probe unit 16 in a small dimension with respect to a direction perpendicular to a test substance.

Electrical interference between the signal probes 38 and the power probes 40 when the group of the signal probes 38 and the group of the power probes 40 are spaced in a direction perpendicular to the test substance, i.e., a vertical direction, is far less than that will be experienced when the group of the signal probes 38 and the group of the power probes 40 are on the same level with respect to a vertical direction, so that harmful influence of electrical interference is reduced greatly.

If the conductive layer 52 formed between the signal probes 38 and the power probes 40 is connected to a portion of a reference potential for testing, such as a ground, electrical interference between the signal probes 38 and the power probes 40 is prevented more effectively by the conductive layer 52. Similarly, if the conductive layer 54 is connected to a part of the reference potential, such as an earth potential, electrical interference between the test substance and the power probes 40 can be prevented.

When the test substance is a flat one, such as a semiconductor wafer, the inspection head 10 is pressed against the test substance so that the probes 38 and 40 are in contact with the terminals of the test substance. When pressed against the terminals of the test substance, the probes 38 and 40 are elastically deformed. The capacitors 42 prevents the influence of noise generated by the power lines on the signal lines.

The present invention is not limited in its practical application to the foregoing embodiment specifically described herein. For example, the inspection head may be provided with flat cables 18 respectively for IC chips formed on a semiconductor wafer. The probe unit 16 may be provided with a plurality of probes to test a plurality of IC chips arranged in a row on a semiconductor wafer by a single test cycle.

What is claimed is:

1. A probe unit comprising:
   a support member having an edge extending in a first direction parallel to the surface of a test substance having the shape of a flat plate;
   a plurality of conductive needle-like probes disposed on the edge and extended in a third direction intersecting both the first direction and a second direction that is perpendicular to the surface of the test substance, the plurality of probes having axes at intervals in the second direction and being divided into at least a first group and a second group; and
   a sheet-like conductive layer being formed between the first and second groups;
   wherein the probes of the second group are disposed closer to the test substance than are the probes of the first group.

2. The probe unit according to claim 1, further comprising a second conductive layer formed at a position nearer to the test substance than the probes of the second group.

3. The probe unit according to claim 1, further comprising at least one flexible flat cable having a first plurality of lead portions electrically connected to the probes of the first group, and a wiring board having a plurality of second lead portions electrically connected to the probes of the second group.

4. The probe unit according to claim 3, further comprising at least one capacitor mounted on the wiring board and electrically connected to the plurality of probes of the second group.

5. An inspection head comprising:
   a plate-shaped support base provided with an opening, and
   at least one probe unit placed on the support base with the probes projecting from one surface of the support base; said probe unit comprising:
   a support member having an edge extending in a first direction parallel to the surface of a test substance having the shape of a flat plate;
   a plurality of needle-like probes disposed on the edge and extended in a third direction intersecting both the first direction and a second direction that is perpendicular to the surface of the test substance, the plurality of probes having axes at intervals in the second direction and being divided into at least a first group and a second group; and
   a sheet-like conductive layer being formed between the first and second groups.

6. The inspection head according to claim 5, wherein a plurality of probe units are arranged side by side on the support base.

7. The inspection head according to claim 6, wherein the support base is further provided with a plurality of first electrodes to be electrically connected to a tester, a plurality of second electrodes electrically connected to the probes of the first group by a flexible flat cable, and a plurality of third electrodes electrically connected to the probes of the second group by a wiring board.

* * * * *